United States Patent [19]

Nath et al.

[11] Patent Number: 5,084,400
[45] Date of Patent: * Jan. 28, 1992

[54] CONVERSION PROCESS FOR PASSIVATING SHORT CIRCUIT CURRENT PATHS IN ELECTRONIC DEVICES HAVING A METALLIC ELECTRODE

[75] Inventors: Prem Nath, Rochester; Craig N. Vogeli, New Baltimore, both of Mich.

[73] Assignee: Energy Conversion Devices Inc., Troy, Mich.

[*] Notice: The portion of the term of this patent subsequent to Mar. 8, 2005 has been disclaimed.

[21] Appl. No.: 602,905

[22] Filed: Oct. 23, 1990

Related U.S. Application Data

[63] Continuation of Ser. No. 242,988, Sep. 12, 1988, abandoned.

[51] Int. Cl.$^5$ ............ H01L 31/18; H01L 21/31
[52] U.S. Cl. ............ 437/4; 437/170; 437/923; 136/258; 136/290; 204/130; 204/140
[58] Field of Search ............ 437/4, 170, 923; 136/258, 290; 204/130, 140

[56] References Cited

U.S. PATENT DOCUMENTS

| | | | |
|---|---|---|---|
| 4,729,970 | 3/1988 | Nath et al. | 437/225 |
| 4,749,454 | 6/1988 | Arya et al. | 204/129.3 |
| 4,785,380 | 11/1988 | Harakawa et al. | 361/433 |
| 4,806,496 | 2/1989 | Suzuki et al. | 437/4 |

OTHER PUBLICATIONS

Bhattacharyya, IBM Tech. Disc. Bull., vol. 15, No. 11 (Apr. 1973), p. 3445.

*Primary Examiner*—Olik Chaudhuri
*Assistant Examiner*—G. Fourson
*Attorney, Agent, or Firm*—Krass & Young

[57] ABSTRACT

An electronic device of the type including a thin film body having a superposed metallic electrode has short circuit defects therein passivated by a conversion process in which the electrical resistivity of the metallic electrode material is increased proximate the defect regions. Conversion is accomplished by exposing the metallic electrode material to a conversion reagent and activating the reagent proximate the defect regions. The process may be utilized for a variety of differently configured devices, and may be readily adapted for use in a roll-to-roll device fabrication process.

14 Claims, 3 Drawing Sheets

CONVERSION PROCESS FOR PASSIVATING SHORT CIRCUIT CURRENT PATHS IN ELECTRONIC DEVICES HAVING A METALLIC ELECTRODE

This is a continuation of co-pending application Ser. No. 242,988 filed on Sept. 12, 1988, now abandoned.

FIELD OF THE INVENTION

This invention relates generally to electronic devices, and particularly to a process for passivating or isolating short circuit current paths which form therein. The invention is most particularly adapted for use in making large area, thin film electronic devices having metallic electrodes, such as capacitors, photovoltaic devices, photodetector arrays, diode arrays, large area optical displays, as well as arrays of memory devices.

BACKGROUND OF THE INVENTION

Single crystal semiconductor devices have been utilized for some time as photovoltaic sources of power, current control devices, photosensor elements, memory elements and the like. However, the utility of such devices is limited by problems associated with the manufacture thereof. More particularly, single crystalline materials (1) are difficult to produce in sizes substantially larger than several inches in diameter, (2) are thicker and heavier than their thin film counterparts; and (3) are expensive and time consuming to fabricate.

Recently, considerable progress has been made in developing processes for depositing thin film semiconductor materials. Such materials can be deposited to cover relatively large areas and can be doped to form p-type and n-type semiconductor materials for the production of semiconductor devices, such as p-i-n type photovoltaic cells, which photovoltaic cells are equivalent, and in some cases superior to those produced by their crystalline counterparts. One particularly promising group of thin film materials are the amorphous materials. As used herein, the term "amorphous" includes all materials or alloys which have long range disorder, although they may have short or intermediate range order, or even contain at times crystalline inclusions. Also, as used herein, the term "microcrystalline" is defined as a unique class of said amorphous materials characterized by a volume fraction of crystalline inclusions, said volume fraction of inclusions being greater than a threshold value at which the onset of substantial changes in certain key parameters such as electrical conductivity, band gap and absorption constant occur.

It is now possible to prepare by glow discharge, or other chemical vapor deposition processes, thin film amorphous silicon, germanium or silicon-germanium alloys in large areas. The alloys so prepared possess low concentrations of localized states in the energy gaps thereof and high quality electronic properties. Suitable techniques for the preparation of such alloys are fully described in U.S. Pat. No. 4,226,898 and U.S. Pat. No. 4,217,374 of Stanford R. Ovshinsky, et al., both of which are entitled "Amorphous Semiconductor Equivalent To Crystalline Semiconductors" and in U.S. Pat. No. 4,504,518 and U.S. Pat. No. 4,517,223 of Stanford R. Ovshinsky, et al. both of which are entitled "Method Of Making Amorphous Semiconductor Alloys And Devices Using Microwave Energy"; the disclosures of all of the foregoing patents are incorporated herein by reference.

It is of obvious commercial importance to be able to mass produce semiconductor devices such as, for example, photovoltaic cells. However, with crystalline semiconductor materials mass production was limited to batch processing techniques by the inherent growth requirements of the crystals. Unlike crystalline silicon, amorphous alloy materials can be deposited in multiple layers over large area substrates to form solar cells and the like in a high volume, continuous processing system. Such continuous processing systems are disclosed in the following U.S. Pat. No. 4,400,409 for "A Method Of Making P-Doped Silicon Films And Devices Made Therefrom"; U.S. Pat. No. 4,410,588 for "Continuous Amorphous Solar Cell Deposition And Isolation System And Method"; U.S. Pat. No. 4,542,711 for "Continuous System For Depositing Amorphous Semiconductor Material"; U.S. Pat. No. 4,492,181 for "Method And Apparatus For Continuously Producing Tandem Amorphous Photovoltaic Cells"; and U.S. Pat. No. 4,485,125 for "Method And Apparatus For Continuously Producing Tandem Amorphous Photovoltaic Cells". As detailed in these patents, the disclosures of which are incorporated herein by reference, a substrate may be continuously advanced through a succession of deposition chambers, wherein each chamber is dedicated to the deposition of a specific semiconductor material. For example, in the manufacture of solar cell of p-i-n configuration, the first chamber of an apparatus is dedicated for the deposition of a p-type alloy material, the second chamber is dedicated for the deposition of an intrinsic alloy material and the third chamber is dedicated for the deposition of an n-type alloy material. Obviously, by utilizing additional chambers or other configurations of chambers, various other semiconductor devices may be similarly manufactured.

As is obvious from the foregoing, thin film materials offer several distinct advantages over crystalline materials, insofar as they can be easily and economically fabricated into a variety of devices by newly developed mass production processes. However, in the fabrication of thin film electronic devices such as the aforementioned photovoltaic devices, the presence of current-shunting, short circuit defects has been observed. These defects have (1) seriously impaired the performance of the electronic devices fabricated therefrom and (2) detrimentally affected production yield. These process-related defects are thought to either be present in the morphology of the substrate or electrode; or develop during the deposition or subsequent processing of the intermediate semiconductor, dielectric or superconducting layers. It is to the end of eliminating, or at least substantially reducing the effects of these current-shunting defects to which the instant invention is directed.

The most important of these defects may be characterized as shunts, short-circuits, defect regions or low resistance current paths, such terms being employed interchangeably herein. Before the suspected causes of these defects are explained, it is helpful to note the typical thicknesses of the deposited intermediate layers. For example, in a p-i-n type electronic device, a typical "p" layer may be only on the order of 250 angstroms thick, a typical "i" layer may be only on the order of 3,500 angstroms thick, and a typical "n" layer may be only on the order of 250 angstroms thick, thereby providing a total semiconductor body thickness of only about 4,000 angstroms. It should therefore be appreciated that irregularities, however small, are not easy to cover by the deposited semiconductor layers.

Shunt defects are present when one or more low resistance current paths develop through the intermediate body of the device allowing current to pass unimpeded between the electrodes thereof. Under operating conditions, a photovoltaic device in which a shunt defect has developed, exhibits either (1) a low power output, since electrical current collected at the electrodes flows through the defect region (the path of least resistance) in preference to an external load, or (2) complete failure where sufficient current is shunted through the defect region to "burn out" the device. Similarly, in thin film electronic resistive devices current is either shunted through the defect region resulting in severely degraded performance of the device, or the defect results in total, complete failure of the device.

While shunt-type defects always deleteriously affect the performance of electronic devices, their effect is particularly profound in photovoltaic devices which are operated under relatively low illumination, such as room light, vis-a-vis, high intensity illumination such as an AM-1 solar spectrum. Under room light illumination, the load resistance of the cell (i.e., the resistance under which the cell is designed to operate most efficiently) is comparable to the shunt resistance (i.e., the internal resistance imposed by the defect regions), whereas under AM-1 illumination, the load resistance is much lower by comparison. Furthermore, in a photovoltaic device, photogenerated current increases linearly with increasing illumination, while the resulting voltage increases exponentially. In other words, voltage attains a relatively high value under low illumination, the value increasing only slightly as the intensity of the illumination is increased. The result is that under low illumination the relatively high voltage potential present preferentially drives the relatively small number of photogenerated current carriers through the path of least resistance, i.e., the low resistance defect regions. In contrast thereto, under high illumination, a large number of current carriers are present and are driven by a potential of about the same magnitude as the potential which exists under low illumination. This larger number of current carriers compete for a limited number of least resistance paths (through the defect regions). The result is that at high intensity, while more power may be lost to the defect region, the power lost is a smaller percentage of the total power produced than at low intensity illumination.

Defects or defect regions, the terms being interchangeably used herein, are not limited to "overt" or "patent" short circuit current paths. In some cases, the adverse effects of a defect are latent and do not immediately manifest themselves. Latent defects can give rise to what will be referred to hereinafter as an "operational mode failure", wherein an electronic, or other semiconductor device, initially exhibiting satisfactory electrical performance, suddenly fails. This type of failure will be discussed in further detail hereinbelow. It is believed the shunt defects, both latent and patent, arise from one or more irregularities in the (1) morphology of the substrate material, or (2) in the growth of the intermediate semiconductor layers.

The first, and perhaps most important, source of the defects, i.e., the aforementioned morphological irregularities in the deposition surface of the substrate material will now be discussed. Even though the highest quality sheet glass or stainless steel is employed to serve as the substrate upon which the conductive base electrode (either transparent oxide or metallic) upon which the intermediate semiconductor layers and the overlying metallic electrode are successively deposited, it has been calculated that from 10,000 to 100,000 irregularities per square centimeter are present on the deposition surface thereof. Such irregularities take the form of projections, craters, or other deviations from a smooth finish and may be under a micron in (1) depth below the surface, (2) height above the surface, or (3) diameter. Regardless of their configuration or size, such defects may establish a low resistance current path through the intermediate semiconductor body, thereby effectively short-circuiting the two electrodes. This may occur in numerous ways. For instance, a spike projecting from the surface of the base electrode may be of too great a height to be covered by the subsequent deposition of semiconductor layers and therefore, be in direct electrical contact with the overlying metallic electrode when said electrode is deposited atop the intermediate semiconductor layers. Likewise, a crater formed in the surface of the substrate may be of too small a size to be filled by the subsequent deposition of the base electrode and semiconductor layers and therefore, be in sufficient proximity to the other electrode, when that electrode is deposited atop the semiconductor layers. In such an instance; (1) electrical current may bridge the gap which exists between the electrodes, or (2) during actual use of the electronic device, the material of one of the electrodes may, under the influence of the electrical field, migrate toward and contact the other of the electrodes, so as to pass electrical current therebetween and thereby give rise to an operational mode failure. It is also possible that in some cases the intermediate layers deposited onto the substrate or base electrode include regions of irregular composition which can provide low resistance paths for the flow of electrical current between the electrodes of the photovoltaic device.

Further, despite efforts to maintain a deposition vacuum envelope free of external contaminants, dust and other particulate matter may either invade the vacuum envelope during the deposition of the intermediate layer material, or forms as a by-product of the deposition process, which are deposited over the substrate electrode along with the semiconductor material. Such contaminants interfere with the uniform deposition of the intermediate layers and may establish low resistance current paths therethrough.

Additionally, it is suspected that in some cases, the intermediate materials form micro-craters or micro-projections during the deposition thereof, (even absent the presence of contaminants or external pollutants). Such morphological deviation from a perfectly smooth and even surface means that the substrate is covered by either (1) an ultra-thin layer of material; or (2) not at all. Obviously, when the overlying metallic electrode material is deposited across the entire surface of the semiconductor body, the thin or open regions thereof create a low resistance current path. In still other cases, the presence of defect regions is only detectable by their deleterious effect upon the electrical and/or photoelectric properties of the resultant device.

In some instances, particular types of electronics devices may operate adequately in spite of the presence of such defects; however other devices, are significantly impaired in function by defects therein. While the defects described hereinabove may, in some instances, not be sufficiently severe to divert all electrical current through the low resistance path, the diversion or shunting of any current therethrough results in some loss in operational efficiency of the electronic device. Moreover, the shunting of even small amounts of current through each of thousands of defect regions will aggregate to cause major losses in efficiency. Based upon the foregoing, it should be apparent that a reduction in the member of defect regions is critical to the fabrication of high-yield, high efficiency, large area, thin film electronic devices.

Several approaches for dealing with this problem have been implemented by the assignee of the instant invention. As described in commonly assigned U.S. Pat. Nos. 4,451,970,; 4,464,823; 4,510,674 and 4,510,675 of Masatsugu Izu and Vincent Cannella, the disclosures of which are incorporated herein by reference, the shunting of current through defect regions may be cured by substantially eliminating the defect regions as an operative area of the electronic device. This is accomplished in an electrolytic process wherein electrode material (in the preferred embodiment, indium tin oxide) is physically removed from the periphery of the defect site, effectively isolating the defect regions and preventing the flow of electrical current from the defect region into the electrode layer. As disclosed in U.S. Pat. No. 4,385,971 of Swartz, defect regions in a solar cell are electrolytically removed in a process which either etches, or bubble-blasts defective semiconductor regions from the solar cell, so as to physically remove material therefrom. However, in those instances where a current collecting structure such as a busbar system or a grid pattern is subsequently applied to the device, care must be taken in utilizing the aforedescribed processes so as to avoid having such conductive structure electrically contact the isolated defect, to avoid creating another short circuit. Consequently, insulating material is generally applied to the isolated regions.

In commonly assigned U.S. Pat. No. 4,419,530 of Prem Nath, entitled "Improved Solar Cell And Method For Producing Same", the disclosure of which is also incorporated herein by reference; there is described a method for electrically isolating defect containing small area segments of an amorphous, thin film, large area photovoltaic device. This isolation of defects is accomplished by (1) dividing the large area device into a plurality of small area segments, (2) testing the small area segments for electrical operability, and (3) electrically connecting only those small area segments exhibiting a predetermined level of electrical operability, whereby a large area photovoltaic device comprising only electrically operative small area segments is formed.

While the method of Nath is effective in reducing or eliminating the effect of shunts, it is not completely satisfactory for several reasons. The step of dividing the semiconductor body into electrically isolated portions requires several production steps and also reduces the total area of the device. Further, the method can be time and cost intensive since the electrical output of each isolated portion must be individually tested and separate electrical connections must be made to provide electrical contact thereto. Also, since an entire segment is effectively eliminated from the final cell if it manifests a defect, losses of efficiency are greater than they would be if only the precise area of the particular defect were eliminated.

Commonly assigned U.S. Pat. No. 4,598,306 of Nath, et al. entitled "Barrier Layer for Photovoltaic Devices", the disclosure of which is incorporated herein by reference, discloses the use of a resistive barrier layer interposed between the semiconductor body and one of the electrodes of a semiconductor device for limiting the amount of electrical current that can flow through defect regions. In this manner, the relatively large short circuit current flowing through defect regions is buffered by the current limiting resistance of the layer. While the foregoing method does improve the production yield of usable semiconductor devices, it interposes an additional series resistance therein, which resistance decreases the operational efficiency of the the device.

Commonly assigned U.S. Pat. No. 4,590,317 and U.S. Pat. application No. 699,523 of Nath, et al., now U.S. Pat. No. 4,633,033, both entitled "Photovoltaic Device And Method", the disclosures of which are incorporated herein, teach the use of various current collecting bus grid structures for the purpose of restricting short circuit current flow in semiconductor devices. According to the teachings therein, the current carrying capacity of grid systems of devices may be effectively restricted through the use of proper geometry, and/or materials. The limited current carrying capacity of such current collecting grids functions to buffer the effects of short circuit current flows through defect regions proximate thereto. While this system does significantly improve device yield, it obviously is of no use for semiconductor devices which do not include a current collecting grid structure therein; additionally, such grid structures, themselves, add some additional series resistance to the device.

Commonly assigned U.S. Pat. No. 4,729,970 to Nath, et al entitled "Conversion Process For Passivating Short Circuit Current Paths In Semiconductor Devices", the disclosure of which is incorporated herein by reference, teaches a method of passivating short circuit defects in electronic devices having electrodes fabricated from a deposited layer of a conductive oxide material. The '970 patent also teaches passivation of thin film electronic devices by employing either Lewis Acids or salts of amphoteric elements as the conversion reagents for passivation purposes. These disclosures teach passivation of current shunting circuit defects by reducing the conductive oxide electrode, proximate the defect regions, to lesser, insulating oxides.

Unfortunately, the teaching of Nath, et al contains no disclosure of a method of passivating short circuit defects in thin film electronic devices comprising exposed metallic electrodes. This is because pure metallic electrodes, such as for example aluminum electrodes, cannot be further reduced to a non-conductive state. One attempt at preventing the generation of short circuit defects between a metallic base electrode found between a substrate and a semiconductor body, and an overlying conductive oxide electrode is disclosed in Japanese Kokai 60-85576 to Fuse.

The Fuse reference teaches passivating short circuit defects by anodizing the metallic (tantalum) base electrode after depositing the semiconductor body thereover, but prior to depositing the conductive oxide top electrode. The anodization then oxidizes any exposed regions of the tantalum base electrode to a non-conductive tantalum oxide. Thus, any tantalum exposed as by vias formed through the semiconductor body, are oxidized to a non-conductive state. While this method has some limited utility for purposes of oxidizing the exposed regions of the metallic base electrode, it should be obvious that such a method could not be used when the metallic electrode is completely exposed since the entire electrode would be anodized to a non-conductive state.

It can be seen from the foregoing that defect regions in thin film electronic devices are a significant problem as is witnessed by the fact that a number of solutions thereto have been proposed by the prior art; however, all of the foregoing prior art solutions suffer from various inadequacies which make them inapplicable in a number of thin film semiconductor devices. For instance, some of the solutions add significant series resistance to devices in which they are incorporated, while other of the solutions can only be used in semiconductor devices which incorporate current collecting grid systems, or conductive oxide electrodes therein.

It accordingly should be apparent that there is a still a need for a method of eliminating or correcting short circuit defects in thin film electronic devices, which method will not add significant series resistance thereto and which may be implemented in a wide variety of devices. As will be apparent from the drawings and detailed description which follows, the instant invention provides for an improved thin film semiconductor device having the defects therein "cured" as well as a method for effecting that cure.

BRIEF DESCRIPTION OF THE INVENTION

There is disclosed herein a method of passivating short circuit defects in an electronic device of the type which includes a thin film body with a superposed electrode comprised of a layer of electrically conductive metallic material. According to the method, a conversion reagent, adapted to convert the electrically conductive metallic electrode material to a material of a higher electrical resistivity, is provided in contact with at least those portions of the electrode proximate defect regions. The conversion reagent is then activated proximate the defects so as to facilitate the conversion reaction. In this manner, the defect regions are substantially, electrically isolated from the remainder of the electrode.

In one embodiment of the instant invention, the electrode is formed of a metal and the conversion reagent alters the metal so as to increase its electrical resistivity. The alteration of the metal may, in some cases, include changing the number of oxygen vacancies therein. Such change in the number of oxygen vacancies is accomplished by utilizing an oxidizing conversion reagent. The conversion reagent may otherwise convert the metal to an insulating form such as an oxide, nitride, carbide, or the like.

In another embodiment, the conversion reagent is activated by passing electrical current through at least the defect regions of the thin film body and into the superposed metallic electrode so as to activate the reagent proximate thereto. Such electrical activation may be accomplished by providing a source of electrical current in communication with both the thin film body and a counter electrode maintained in electrical communication with the conversion reagent. In other instances, the conversion reagent may be activated by heating or illumination.

The conversion reagent may in some instances, include therein oxidizing acids, such as $H_2SO_4$, $H_3BO_3$, $H_3PO_4$ and $H_2CrO_4$. A preferred conversion reagent is sulphuric acid ($H_2SO_4$). The conversion reagent may be in aqueous solution but may include a non-aqueous solvent.

The method of the instant invention may also be utilized to passivate latent short circuit defects, in which instance the method includes the further step of activating the latent defects so as to convert them to actual short circuit defects which are then passivated. Activation of the latent defects may include passing an electrical current therethrough. In some instances activation of the latent defects may be accomplished prior to the activation of the conversion reagent and subsequent passivation. In other instances the latent defect may be activated concommitant with the activation of the conversion reagent.

DETAILED DESCRIPTION OF THE DRAWINGS

I. Defects in Semiconductor Devices

Figure 1:
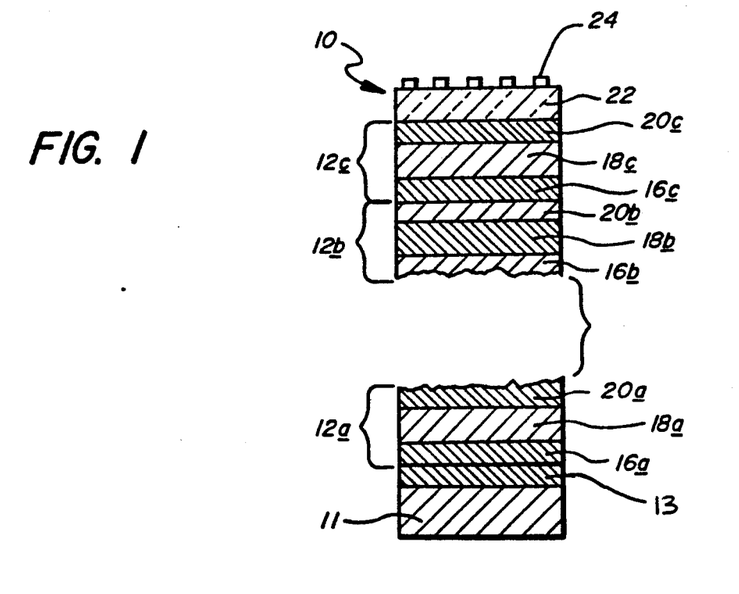
FIG. 1 is a fragmentary cross-sectional view of a tandem photovoltaic device comprised of a plurality of n-i-p type photovoltaic cells.

Referring now to the drawings, where like reference numbers designate like structure, and particularly to FIG. 1, a stacked, tandem, or cascade-type, photovoltaic device, formed of successive n-i-p layers each including an amorphous semiconductor alloy, is shown generally by the reference numeral 10. The present invention may be employed in conjunction with the fabrication of such photovoltaic cells; however, it is to be understood that the instant invention is not limited to photovoltaic cells or to semiconductor devices of any particular composition or configuration but may be employed to mitigate the effect of defects in any electronic device having a thin film semiconductor or dielectric body and a superposed metallic electrode disposed atop of said body.

FIG. 1 shows a tandem photovoltaic device 10, which includes a photovoltaic semiconductor body 12 adapted to generate a flow of electrical current in response to the absorption of photons incident thereupon, and consisting of a plurality of n-i-p photovoltaic cells 12a, 12b, and 12c. Below lowermost cell 12a is a substrate 11 which may be formed from a transparent electrically insulating material such as, for example, glass, synthetic polymeric resins and the like. Disposed immediately atop of said transparent, electrically insulating substrate 11, is a layer of transparent electrically conductive material 13, which serves as the base electrode of the photovoltaic device. This layer 13, is deposited atop the substrate 11 in a continuous process, or in a separate environment. In one embodiment, the transparent conductive layer 13 is formed of indium tin oxide although other transparent conductive materials such as zinc oxide, cadmium stannate, tin oxide and indium oxide as well as various mixtures thereof are known to skilled practitioners and may also be suitably employed to form said electrode 13.

Although certain applications may require the application of a thin oxide layer and/or a series of base contacts deposited upon the substrate prior to the deposition thereupon of the semiconductor material, for purposes of this application, the term, "substrate" shall also include any elements added thereto by preliminary processing.

As illustrated, each of cells 12a, 12b and 12c includes a semiconductor body containing at least a silicon alloy. Each of the alloy bodies includes a p-type region or layer (16a, 16b or 16c); an intrinsic region or layer (18a, 18b or 18c); and an n-type region or layer (20a, 20b or 20c). As illustrated, cell 12b is an intermediate cell and, as indicated in FIG. 1, additional intermediate cells may be stacked atop the illustrated cells without departing from the spirit or scope of the present invention. Also, although stacked p-i-n cells are illustrated, this invention is equally adapted for single or stacked n-i-p cells, it being understood that the term "n-i-p type cell" as used herein is meant to include any triad of n, i and p semiconductor layers operatively disposed to provide a photoactive region for generating charge carriers in response to the absorption of photon energy.

For each of cells 12a, 12b and 12c, the p-type layers are characterized by low light absorption, high conductivity, layers of preferably microcrystalline, semiconductor alloy material. The intrinsic alloy layers are characterized by an adjusted wavelength threshold for a solar photoresponse, high light absorption, low dark conductivity and high photoconductivity and may include sufficient amounts of a band gap adjusting element or elements to optimize the band gap for the particular cell application. Preferably, the intrinsic layers are band gap adjusted to provide cell 12c with a lowest band gap, cell 12a with the highest band gap, and cell 12b with a band gap between the other two. The n-type layers are characterized by low light absorption, high conductivity, preferably microcrystalline, alloy layers. The thickness of the n-type layers is preferably in the range of about 25 to 500 angstroms. The thickness of the band gap adjusted, amorphous intrinsic alloy layers is preferably between about 2,000 angstroms to 30,000 angstroms. The thickness of the p-type layers is preferably between 25 to 500 angstroms.

The photovoltaic device 10, further includes a top, exposed electrode 22 formed from a layer of a deposited metallic, electrically conductive material. This layer of metallic, conductive material 22 may be deposited upon the semiconductor body 12 in a continuous process or in a separate environment. The metallic, conductive material is typically selected from the group consisting of aluminum, copper, titanium, tantalum, zirconium, chromium, silver, cadmium and combinations thereof. In a preferred embodiment, the metallic, conductive electrode 22 is formed from a deposited layer of aluminum. The photovoltaic device 10, may also include a bus grid pattern 24 formed of a highly conductive material to assist in the collection of photogenerated current. The bus grid pattern is typically formed of a metal such as copper on silver, and aids in collection of photogenerated current.

As discussed previously, problems occur in semiconductor devices, when short circuit producing defect regions are present in the semiconductor body, since these defects can divert substantial amounts of current therethrough. The problem is especially significant when an electronic device includes a highly conductive electrode member disposed atop the intermediate body, i.e., a thin film semiconductor, or dielectric body. This is because in those instances, the electrodes can communicate with the short circuit producing defect and effectively short circuiting the entire device therethrough. In the case of photovoltaic devices, such defects can shunt a substantial portion, if not all, of the output photocurrent therethrough thus rendering the device substantially inoperative. In photosensor arrays, the presence of such a short circuit defect will degrade signal output of the device. In dielectric devices, such as capacitors, the insulating properties may be wholly destroyed by the presence of defect regions. Similar detrimental effects will occur in other devices such as diode arrays, memory devices, integrated circuits and the like.

Figure 2:
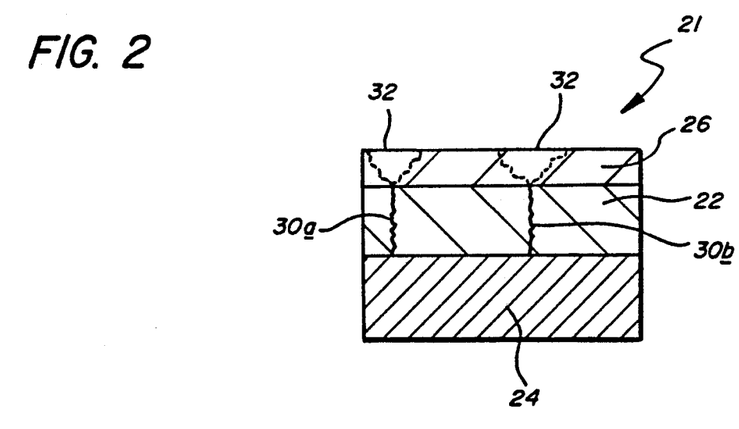
FIG. 2 is a stylized, cross-sectional view of a semiconductor device including two short circuit defect regions therein.

Referring now to FIG. 2, there is shown an electronic device 21 for the purpose of illustrating the types of defects addressed by the instant invention. The device 21 is a stylized depiction of a electronic device and it is meant to represent any one of a great number of devices including for example photovoltaic devices, photosensors, diodes and the like. The device 21 includes an intermediate, body 22 disposed upon a substrate member 24 which, in this embodiment, forms a base electrode for the device. Included is a metallic top electrode member 26 in superposed relationship with the intermediate semiconductor body 22. Illustrated within the intermediate body 22 are two defect regions 30a, 30b which establish a short circuit current path between the metallic top electrode 26 and the base electrode 24 of the device 21. Although the defect paths 30a, 30b are shown as linear structures passing through the semiconductor body 22, it should be noted that this is for purposes of illustration only and such paths may alternatively be formed by a raised protuberance which extends from the substrate 24 and passes through the semiconductor body 22, or they may be formed by pinholes, craters or other inclusions in the intermediate body 22 which allow material of the top electrode 26 to infiltrate therethrough and establish a low resistance current path to the base electrode 24. It should thus be kept in mind that the illustration of the defect regions 30a, 30b in FIG. 2, and the succeeding FIGS., are meant to include all of the foregoing types of defects which establish a short circuit or other low resistivity current paths through a semiconductor device.

Since the defect regions 30a, 30b are in electrical communication with the metallic top electrode 26 of the electronic device 21, and since that electrode is formed of a relatively high conductivity material, a large portion of the surface of such a defect containing semiconductor device will be in good electrical communication with, and hence under the influence of, the defect regions. By increasing the electrical resistivity of the metallic top electrode layer 26, the portion of the electrode which will be detrimentally affected by an underlying short circuit defect may be somewhat restricted by the lateral resistivity of that material. However, as previously discussed, this approach does increase series resistivity of a semiconductor device in which it is implemented. As illustrated in FIG. 2, the effect of the defects 30a, 30b may spread beyond the immediate proximity of their contact with the metallic top electrode layer 26 owing to the lateral conductivity therethrough. For purposes of illustration, the area which is in good electrical communication with the defects is indicated by phantom outline regions 32 formed thereabout.

In a similar manner, defects in thin film layers of other electronic devices, such as capacitors would also be detrimental. For example, capacitors formed by disposing a dielectric body between two highly conductive electrodes. A pinhole in the dielectric, or an irregularity associated with the electrodes can establish a short circuit path rendering the capacitor inoperative. Similar problems will obviously arise with other devices such as threshold switches, photosensors and the like.

II. Passivation of Defects

According to the instant invention, high conductivity defect regions in the intermediate body of an electronic device may be effectively passivated by converting the portion of the metallic, conductive electrode material overlying a defect region to a high resistivity material or form thereof. In this manner, the current paths between the high conductivity defect region and the majority of the conductive electrode is terminated. Because conversion of the electrode material takes place only proximate the defects, there is no overall increase (or decrease) in the resistivity of the metallic electrode material, and therefore the overall series resistance of the electronic device is not increased.

There are a wide variety of materials which may be employed to form the top, conductive electrode of an electronic device. Such materials include metals, degenerate semiconductors, and cermets, with preferred materials being metals such as aluminum, copper, magnesium, titanium and silver. The most preferred electrode material is aluminum. The particular conversion reagent employed will depend upon the nature of the electrode material, the only requirement being that the conversion reagent be capable of converting the electrode material to a high resistivity form adjacent defect regions when activated, while leaving the remainder of the electrode material relatively unaltered. Conversion of the metallic electrode material is by the oxidation thereof or other chemical or physical reaction which changes the composition or stoichiometry of the metallic electrode material. Specifically, a metallic material when converted to its oxided, nitrided, carbided, etc. form will generally exhibit a significant increase in electrical resistivity.

The conversion reagent employed to oxidize the layer of metallic electrode material depends, to a great extent, upon the metal chosen to form the electrode. Since the preferred electrode metal is aluminum, a preferred conversion reagent for use therewith is sulfuric acid ($H_2SO_4$) or a sulfuric acid solution, such as for example, a ten percent solution of $H_2SO_4$ in water. Additionally, sulfuric acid may be successfully employed in the oxidation of many other metallic electrodes, such as for example those fabricated from titanium, tantalum and copper. Although sulfuric acid is by far the most common of oxidizing conversion reagents, many others are in use, particularly for the attainment of special effects or special properties. For example, chromic acid ($H_2CrO_4$) may be employed to yield opaque oxidized regions. Alternatively oxalic acid yields yellowish, somewhat "hard" oxidized regions. Other conversion reagents which may be employed in this process include, but are not limited to, phosphoric acid ($H_3PO_4$), boric acid ($H_3BO_3$) and sulfonated organic acids combined with sulfuric acid. Of course, many aqueous solutions of these reagents may also be employed with equal success.

Activation of the conversion reagent may be accomplished by a variety of energetic inputs, depending upon the particular reagent and processing conditions employed. For example, activation of the conversion reagent may be achieved by input of light, heat or electrical energy to the conversion reagent in regions proximate the defects being passivated. If an electrical bias is applied to a electronic device including low resistivity defects, electrical current will preferentially flow through the low resistivity defect paths. In this manner, current may be selectively provided to the defect regions by controlling magnitude and/or polarity of the current applied. Similarly, heating may be effected by passage of an electrical current through defect regions and in this manner thermal activation may be selectively achieved. The advantage of such a process is that one need not actually locate the defects in order to passivate them. The process is essentially "self-finding" since the flow of current through the defects activates the conversion reagent proximate thereto.

Figure 3:
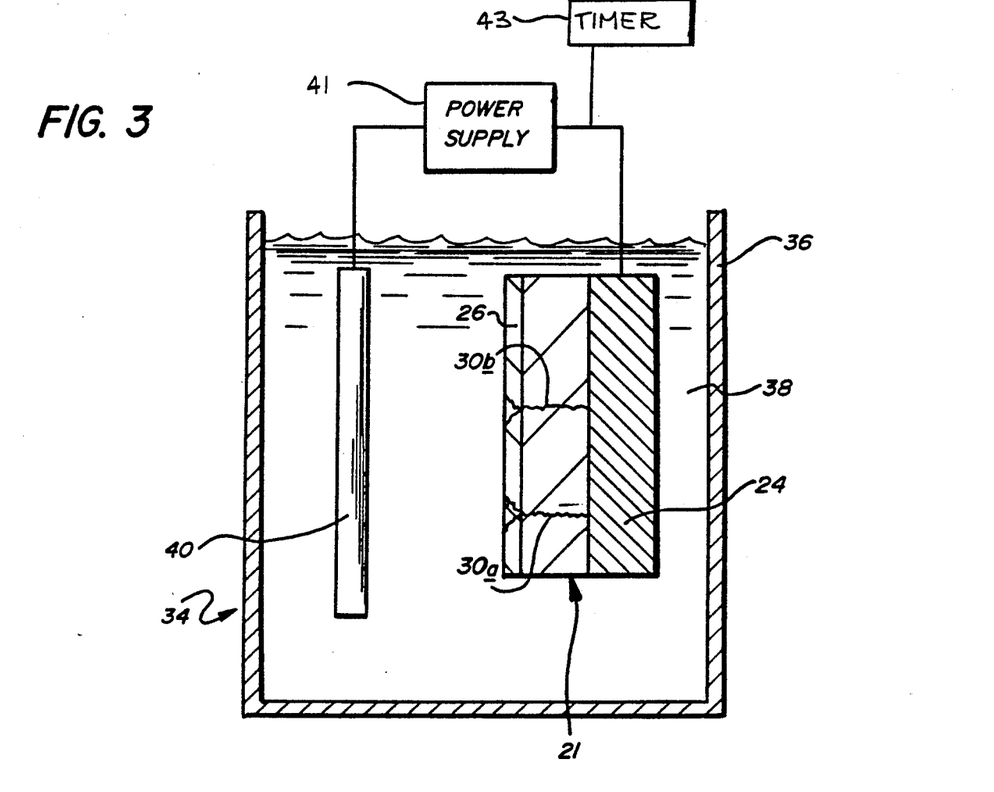
FIG. 3 is a cross-sectional view illustrating an apparatus adapted to carry out the method of the instant invention by converting the resistivity of the conductive oxide electrode of a semiconductor device.

The process of the instant invention may be better explained with reference to FIG. 3, which is a depiction of an apparatus for electrically and/or thermally activating a conversion reagent. The apparatus 34 of FIG. 3 includes a vessel 36 such as a beaker or tank containing therein a solution of the conversion reagent 38 as discussed previously. As shown in FIG. 3, an electronic device 21, generally similar to the device described with reference to FIG. 2, is disposed within the tank 36 of the apparatus 34. Also disposed in the tank 36 is a counter electrode 40. The apparatus 34 further includes a power supply 41 which is in electrical communication with both the counter electrode 40 and the semiconductor device 21. It will be noted that electrical contact is made to the substrate electrode 24 of the semiconductor device 21 so that electrical current will flow through the substrate electrode 24 and then through the defect regions 30a, 30b to the metallic top electrode 26 of the device 21. It is this flow of electrical current which limits the activation of the conversion reagent 38 to those regions proximate the short circuit defects 30a, 30b. As mentioned hereinabove, activation may be directly accomplished by the flow of current or may be a secondary effect resultant from heating of the material of the electrode 26 by the current flow.

As will be appreciated by those skilled in the electrochemical arts, control of the conversion reaction may be achieved by control of polarity, magnitude, and duration of the electrical current provided by the power supply 41. In order to control the duration of the provided electrical current, a timer device 43 may be electrically interconverted between semiconductor device 21 and the power source 41. The timer device 43 is adapted to provide a preselected voltage for a desired length of time.

Figure 4:
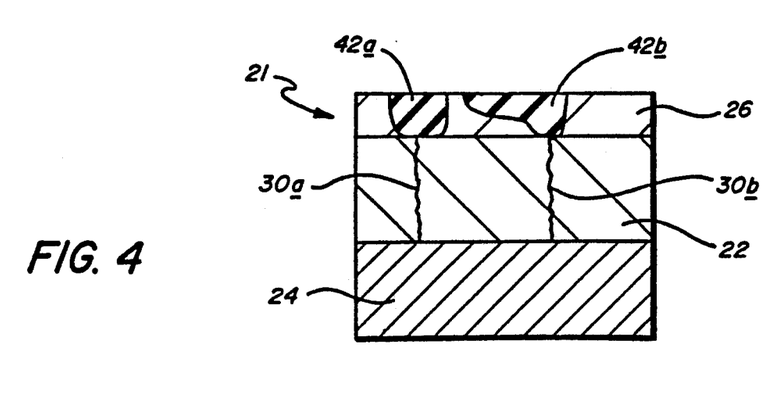
FIG. 4 is a stylized, cross-sectional view of a semiconductor device including two defect regions in the semiconductor body thereof and two corresponding portions of the superposed metallic electrode, which have been exposed to the apparatus of FIG. 3 so as to increase the resistivity thereof.

FIG. 4 is a cross-sectional view of the electronic device 21 of FIG. 3 after passivation of the defects thereof. It will be noted that the defect regions 30a, 30b, still remain in the semiconductor body 22; however, portions 42a, 42b, of the electrically conductive material of the metallic top electrode 26 have been converted to a high electrical resistivity form thereof. The first portion 42a is proximate the defect region 30a and the second high resistivity portion 42b is proximate the second defect region 30b.

Figure 5A:
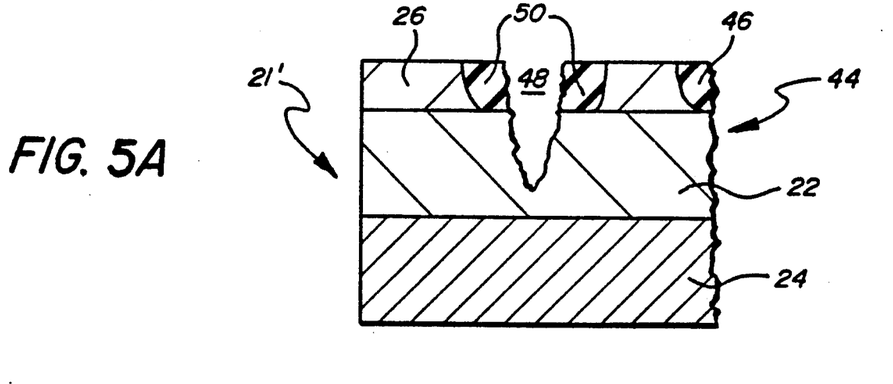
FIG. 5A is a stylized, cross-sectional view of a semiconductor device structured in accord with the principles of the instant invention and including therein a scribed region and a cut edge having short circuit defects associated therewith, and illustrating the conversion of portions of the top electrode layer to high resistivity material proximate the cut and scribed edges.
Figure 5B:
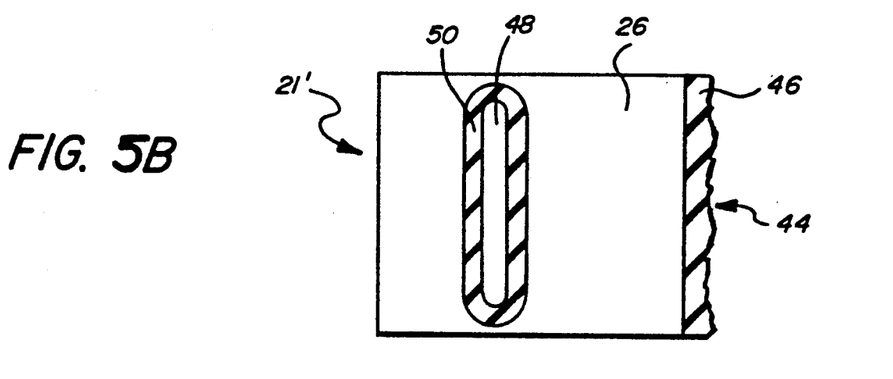
FIG. 5B is a top-plan view of the semiconductor device of FIG. 5A, illustrating the conversion of the conductive material of the top electrode layer to a high resistivity form thereof.

FIG. 5A and 5B are illustrative of the utility of the instant invention in passivating defects occasioned by the severing, scribing or inadvertent scratching of electronic devices during the processing thereof. FIG. 5A is a cross-sectional view of an electronic device 21' which is generally similar to the device 21 of the foregoing figures. Included in the device 21' are a substrate layer 24 which provides one electrode thereof, an intermediate body 22 and a metallic top electrode 26 in superposed relationship with the intermediate body 22. As illustrated, the device 21' of FIG. 5A also includes a cut edge 44, depicted by a jagged line. This edge is typical of those produced by severing electronic devices with mechanical shears, lasers, water jets or other such methods. As will be readily appreciated by those skilled in the art, such a cut edge 44 frequently produces short circuit defects proximate thereto which establish a short circuit current path through the intermediate body 22 of the device 21. It will be noted from the figure that a portion 46, of the material of the top electrode 26 proximate to the cut edge 44 has been converted to a high resistivity form so as to isolate the short circuit defect at that edge 44 from the remainder of the device.

The semiconductor device 21' of FIG. 5A also includes therein a channel 48 extending through a portion of the semiconductor body 22. This channel 48 is meant to represent a scribe line made for purposes of subdividing the device 21'. Alternatively the channel may represent an inadvertent scratch occasioned during handling. Such cuts may be made by lasers, water jets or mechanical scribes whereas scratches arise through inadvertent contact of the device 21' with abrasive portions of processing apparatus and the like. Whatever the cause of the channel 48, it has been found that short circuit defects are frequently created proximate thereto, just as for a cut edge. It will be noted from the FIG. that through the use of the instant invention, portions 50 of the metallic top electrode 26 proximate to the channel 48 have been converted to a high resistivity form thereof.

Referring now to FIG. 5B, there is shown a top plan view of the same semiconductor device 21' illustrating better the passivated, high resistivity regions 46, 50 formed proximate the cut edge 44 and the channel 48.

It should be noted at this point that as mentioned previously, not all defects manifest themselves immediately. Latent defects may be present in electronic devices and not manifest themselves until the devices have operated for some time. As is known to those skilled in the art, such latent defects may be activated so as to convert them to active defects. Such activation may, for example, be by passage of an electrical current through the device, or by photoactivation. The instant invention may be utilized to passivate latent defects which have been thus activated. Activation of latent defects may be either prior to or concomitant with the defect curing procedure. Prior activation may be done when the electronic devices are fabricated or at any other time before passivation. Concomitant activation of latent defects may be accomplished during the passivation process as for example, by the current passed through the semiconductor body to activate the conversion reagent. In some instances this current will be sufficient to activate latent defects, whereas, in other instances a higher voltage and/or amperage will need to be employed. It may be desirable in some instances to tailor the voltage and/or amperage profile employed to provide an initially higher latent defect activating current followed by a relatively lower passivating current.

Figure 6:
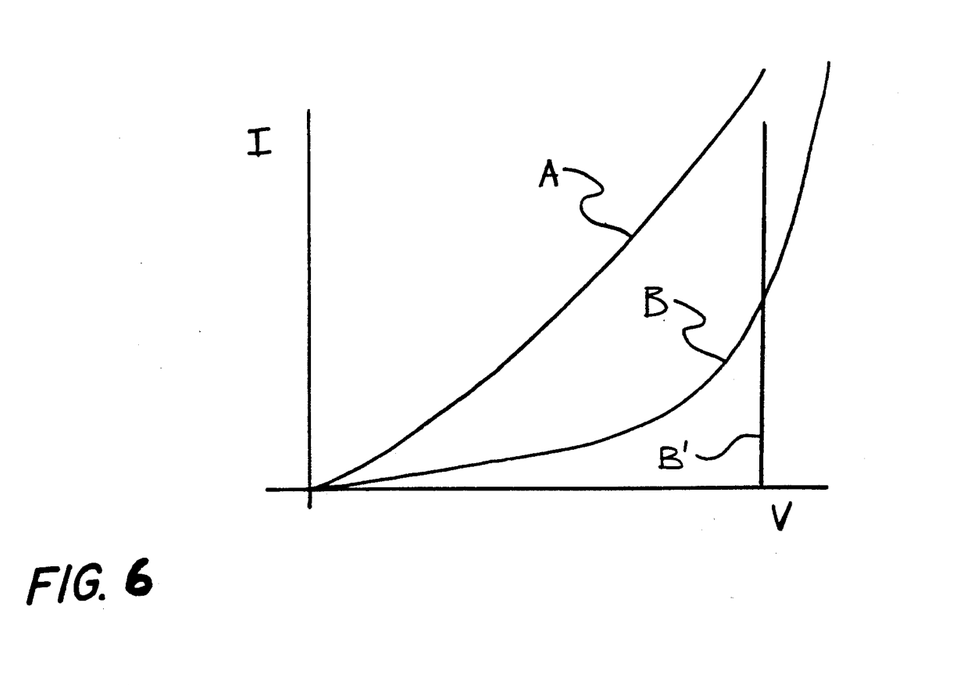
FIG. 6 is a graphic representation comparing the I-V characteristic of a photovoltaic device having defects therein, with the I-V characteristic of the same device after passivation by the method of the instant invention; and, FIG. 7 is a schematic illustration of an apparatus adapted to passivate defect regions in semiconductor device material disposed upon the elongated web of substrate material, in a roll-to-roll process.

Turning now to FIG. 6, there is illustrated therein the I-V characteristic of a photovoltaic device, before passivation, curve A, and after passivation, curve B. As is well known in the photovoltaic art, properly functioning photovoltaic devices demonstrate a characteristic I-V curve such as that illustrated in curve B. The presence of a substantially linear I-V characteristic, such as that depicted in curve A indicates the presence of short circuit defects in the photovoltaic device. It is important to note that a photovoltaic device possessing the characteristic of curve A can be passivated by the process described herein so that its I-V characteristic is corrected and the device operates along the characteristic depicted in curve B.

FIG. 6 further depicts a preferred voltage at which activation of the conversion reagent occurs. As is shown by line B', the voltage for activation of the conversion reagent should be at approximately the anodic breakdown point of the metallic upper electrode, i.e., the point at which the formation of oxides of the metallic electrode is favored. Of course, the applied voltage should never exceed the anodic solubilization voltage, since at this point the metallic electrode would actually begin to dissolve into the conversion reagent.

Figure 7:
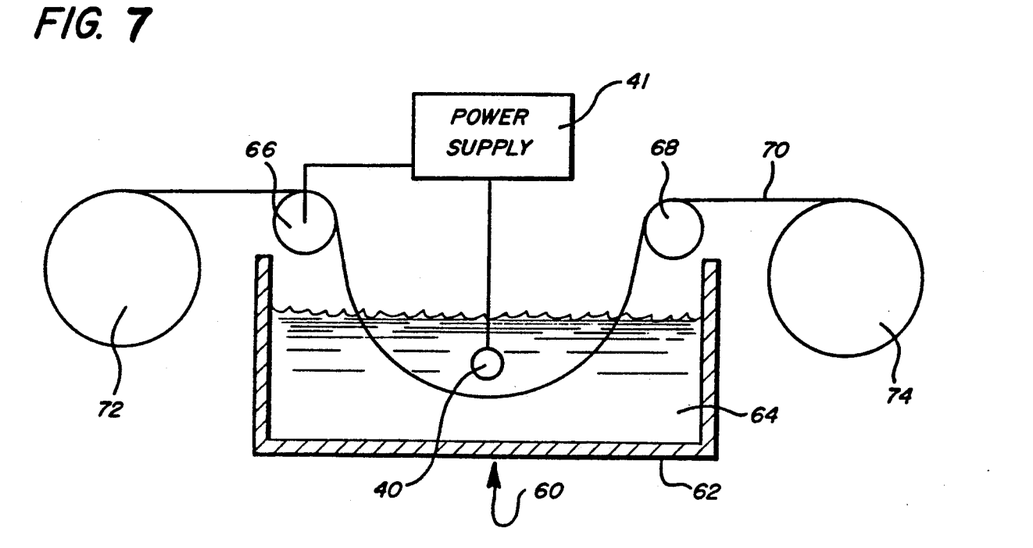

The instant invention may be readily adapted to a variety of modes of operation by one skilled in the art. For example, the instant invention may be carried out in a continuous roll-to-roll process. Referring specifically to FIG. 7, there is shown an apparatus 60 which includes a tank or vat 62 having a conversion reagent 64 contained therein. The apparatus also includes a first roller 66 and a second roller 68 adapted to direct an elongated web of substrate 70 coated with semiconductor material through the conversion reagent 64. A payoff roller 72 and a takeup roller 74 are disposed to continuously advance the coated substrate 70 through the conversion reagent 64, and the apparatus further includes a power supply 41 having a counter-electrode 40 associated with one terminal thereof. The power supply 41 establishes electrical communication with the semiconductor coated web 70 via one of the rollers, in this case the first roller 66.

In operation, the payoff 72 and takeup 74 rollers continuously advance the coated substrate 70 through the conversion reagent 64 while the power supply 41 is activated to provide a bias current through the semiconductor layer. The conversion reagent 64 passivates defects in the electronic device as mentioned previously.

Other variations of the instant invention will also be apparent to one of skill in the art. For example, a semiconductor coated substrate may be disposed in a vat of conversion reagent and a laser beam used to simultaneously (1) scribe or otherwise pattern the intermediate body and (2) passivate defects created by the scribing process, in which instance the laser energy will be utilized to activate the conversion reagent.

EXAMPLE

A photovoltaic device generally identical to that described hereinabove with reference to FIG. 1 was prepared. The upper electrode of said device was fabricated from aluminum, and said device included at least one short circuit defect region therein. The photovoltaic device was attached to an apparatus such as that depicted in FIG. 3, so that the photovoltaic device effectively became the anode of the apparatus. Precautions were taken to prevent the photogenerative material from making contact with the conversion reagent, therefore the photogenerative material was isolated from the reagent. A stainless steel plate was provided as a cathode plate. The photovoltaic device, and cathode plate were operatively connected to the timer and power supply as shown in FIG. 3, and were inversed in a 10% sulfuric acid conversion reagent (100 g $H_2SO_4$/1 liter $H_2O$). The power source and timer element provided a 1-2 second pulse of 5 volts to the photovoltaic device/cathode assembly. It has been found that an exposure time of 1-4 seconds with a bias of 1-10 volts is sufficient to convert the metallic electrode, proximate semiconductor defect regions, to a higher resistivity metallic oxide. Longer exposure, i.e., 20-30 seconds, are sufficient to increase the resistivity of the entire layer of electrode material by at least a factor of 10 to 100. Thereafter, the photovoltaic device was removed from the conversion reagent, rinsed of residual conversion reagent and dried.

The resulting photovoltaic device was a totally passivated photovoltaic device, displaying the type of I-V characteristic demonstrated in curve B of FIG. 5. In those areas of the aluminum electrode which were proximate short circuit defect regions, the aluminum had been converted to a higher resistance form than other areas not proximate defects (assuming a sufficiently high lateral sheet resistance in the aluminum). The applied voltage and the conversion reagent caused the aluminum to oxidize to the electrically resistive $Al_2O_3$ form, effectively disconnecting the short circuit defect area from the rest of the photovoltaic device.

While the foregoing example was primarily concerned with the use of a sulfuric acid solution to passivate defects in a photovoltaic device having an aluminum electrode, a chemist of ordinary skill in the art would be readily able to analogize this example to other materials having similar reactivities. For example, copper, tin and other such metallic materials react chemically in a manner generally similar to aluminum. Similarly, there are a wide variety of reagents analogous to sulfuric acid, all of which could be readily utilized by one of ordinary skill in the art without undue experimentation.

It should finally be noted that although the instant invention has been described primarily with reference to photovoltaic devices, it can obviously be utilized with any electronic device in which defect regions create short circuit problems. For example, the instant invention may be utilized to passivate defects in devices such as capacitors, photosensors, liquid crystal display devices, diodes, threshold switches, memory devices and various arrays and combinations thereof. It should therefor be recognized that the foregoing examples, description and discussion are merely meant to be illustrative of the principles of the instant invention and not meant to be a limitation upon the practice thereof. It is the following claims, including all equivalents, which are meant to define the scope of the instant invention.

What is claimed is:

1. A method of passivating short circuit defects in a thin film large area photovoltaic module comprising a substrate electrode, an intermediate body including a plurality of continuous layers disposed atop said substrate and selected from the group consisting of dielectrics, semiconductors, and combinations thereof, and an electrode disposed atop said intermediate body, said electrode comprising a layer of electrically conductive metallic material, said method comprising the steps of:

providing a solution of an oxidizing conversion reagent, including therein an acid, selected from the group consisting of $H_2SO_4$, $H_3PO_4$, $H_3BO_3$, $H_2CrO_4$ and combinations thereof, in contact with at least those portions of said metallic electrode proximate said defects, said oxidizing conversion reagent capable of converting the metallic electrode material to a material of higher electrical resistivity; and disposing a counter-electrode in electrical communication with said solution of said conversion reagent;

providing a power supply in electrical communication with both said counter-electrode and said substrate electrode of said photovoltaic module for applying a potential between said substrate electrode and said counter-electrode;

energizing said power supply to apply a potential difference between said substrate electrode and said counter-electrode for activating said oxidizing conversion reagent proximate said defects so as to facilitate conversion of the metallic electrode material to said higher resistivity form, whereby said defects regions are substantially electrically isolated from the remainder of said metallic electrode material.

2. A method as in claim 1, wherein the step of activating the conversion reagent to facilitate conversion of the metallic material includes exposing said metallic material to oxidizing conditions.

3. A method as in claim 1, wherein the step of activating the conversion reagent includes the further step of passing an electrical current through at least the defect regions of the thin film device and into the superposed metallic electrode so as to activate the conversion reagent proximate at least areas of said metallic electrode adjacent said defect regions.

4. A method as in claim 3, including the further steps of providing a counter-electrode disposed in electrical communication with the conversion reagent and the metallic electrode of the thin film device; and, providing a source of electrical current in electrical communication with the intermediate body.

5. A method as in claim 1, wherein the step of activating the oxidizing conversion reagent includes the step of heating the reagent proximate said defects.

6. A method as in claim 1, wherein the step of activating the oxidizing conversion reagent includes the step of illuminating the conversion reagent proximate said defects.

7. A method as in claim 1, wherein the preferred oxidizing conversion reagent is sulfuric acid ($H_2SO_4$).

8. A method as in claim 7, wherein the step of providing a conversion reagent comprises providing an aqueous conversion reagent.

9. A method as in claim 8, wherein the step of providing a conversion reagent comprises providing a 10% solution of sulfuric acid in water.

10. A method as in claim 1, wherein the step of providing a conversion reagent comprises providing a reagent including a non-aqueous solvent therein.

11. A method as in claim 1, wherein the electronic device includes at least one latent defect therein, said method including the further step of: activating said at least one latent defect so as to convert it to a short circuit defect.

12. A method as in claim 11, wherein the step of activating latent defects includes passing an electrical current through said defects.

13. A method as in claim 12 wherein said latent defects are activated prior to the activation of said conversion reagent.

14. A method as in claim 12, wherein said latent defects are activated concommitant with the activation of said conversion reagent.

* * * * *